United States Patent
Kell

(10) Patent No.: US 12,062,900 B2
(45) Date of Patent: Aug. 13, 2024

(54) METHOD FOR THE DETECTION OF AN ARC FAULT IN AN ELECTRICAL CIRCUITRY, AND MOTOR VEHICLE

(71) Applicant: AUDI AG, Ingolstadt (DE)

(72) Inventor: Viktor Kell, Neustadt (DE)

(73) Assignee: AUDI AG, Ingolstadt (DE)

( * ) Notice: Subject to any disclaimer, the term of this patent is extended or adjusted under 35 U.S.C. 154(b) by 274 days.

(21) Appl. No.: 17/509,928

(22) Filed: Oct. 25, 2021

(65) Prior Publication Data

US 2022/0131359 A1  Apr. 28, 2022

(30) Foreign Application Priority Data

Oct. 26, 2020 (DE) .......................... 102020128054.8

(51) Int. Cl.
| | |
|---|---|
| *H02H 3/00* | (2006.01) |
| *G01R 19/165* | (2006.01) |
| *H02H 1/00* | (2006.01) |
| *H02H 3/08* | (2006.01) |
| *H02H 9/08* | (2006.01) |
| *H02P 29/024* | (2016.01) |

(52) U.S. Cl.
CPC ..... *H02H 1/0015* (2013.01); *G01R 19/16571* (2013.01); *H02H 3/08* (2013.01); *H02P 29/024* (2013.01)

(58) Field of Classification Search
CPC ...... H02H 1/0015; H02H 3/08; H02P 29/024; G01R 19/16571

USPC .......................................................... 361/42
See application file for complete search history.

(56) References Cited

U.S. PATENT DOCUMENTS

| | | | |
|---|---|---|---|
| 7,068,045 B2* | 6/2006 | Zuercher .............. | H02H 1/0015 324/536 |
| 2003/0080621 A1* | 5/2003 | Kirk ....................... | H02H 3/087 307/10.7 |
| 2008/0143461 A1* | 6/2008 | Hastings .................. | H02H 7/18 335/7 |
| 2014/0218044 A1* | 8/2014 | Ostrovsky ............ | H02H 1/0015 340/650 |
| 2016/0349301 A1* | 12/2016 | Wortberg ............... | G01R 31/40 |
| 2018/0083434 A1 | 3/2018 | Lim et al. | |

FOREIGN PATENT DOCUMENTS

| | | |
|---|---|---|
| DE | 102014222878 A1 | 5/2016 |
| DE | 102015209588 B3 | 10/2016 |

* cited by examiner

*Primary Examiner* — Jared Fureman
*Assistant Examiner* — Lucy M Thomas
(74) *Attorney, Agent, or Firm* — Seed IP Law Group LLP

(57) ABSTRACT

A method detects an arc fault in an electrical circuitry. The electrical circuitry includes a controller, an energy storage and a plurality of loads each connected to the energy storage via a respective load path. A current measuring device determines current measurement values describing an energy storage current is assigned to the energy storage. Voltage measuring devices for determining voltage measurement values describing a load voltage at the respective load are assigned to said loads. The current measurement values and voltage measurement values are continuously transmitted to the controller via at least one communication link.

17 Claims, 5 Drawing Sheets

METHOD FOR THE DETECTION OF AN ARC FAULT IN AN ELECTRICAL CIRCUITRY, AND MOTOR VEHICLE

BACKGROUND

Technical Field

The disclosure relates to a method for detecting an arc fault in an electrical circuitry, wherein the electrical circuitry includes a controller, an energy storage and multiple loads connected to the energy storage via a load path in each case. The disclosure also relates to a motor vehicle.

Description of the Related Art

In an electrical circuitry, from a voltage level of approximately 24 V onwards, arcs can occur, for example if damage to the insulation of lines and/or other components of the electrical circuitry has occurred. Such an arc constitutes a fault state that can damage components of the electrical circuitry and/or in the vicinity of the circuitry.

In motor vehicles that have an onboard electrical system with a voltage of 24 V or more, e.g., 48 V, individual line sections of the onboard electrical system, in which there is a risk of the occurrence of an arc, are usually placed in a safe area. This produces a passive protection, because in this way the occurrence of arcs can be prevented or at least can be made more difficult and/or should arcs occur, further damage to the motor vehicle, in particular a fire in the vehicle, can be avoided.

In addition or as an alternative to passive protective measures active protective measures may also be used, which generally consist of additional hardware which is integrated into the onboard electrical system and which in case of a fault, such as the occurrence of an arc, triggers a shutdown of the onboard electrical system. This hardware uses additional installation space in the motor vehicle and generates additional costs in the manufacture of the motor vehicle. Various methods for detecting arcs in electrical circuits are known from the prior art.

In DE 10 2014 222 878 A1, a motor vehicle supply system is described which has a current source, a power distributor connected to said current source via a supply current path, and at least one load connected to said power distributor via a load current path with an integrated semiconductor switch. Said power distributor includes a current measuring unit, a voltage measuring unit, and a monitoring unit, said monitoring unit identifying an imminent fault on a basis of measurement data from said current measuring units. In this case, said at least one load is switched off by means of said semiconductor switch, when an overcurrent fault or an arc fault has been identified.

DE 10 2015 209 588 B3 discloses a device for identifying faults in an onboard electrical system in a vehicle. The device includes a reception unit which receives a first and a second temporal sequence of current measurement values or voltage measurement values, wherein the measurement values of the first sequence are measured at a first measuring point of the onboard electrical system and the measurement values of the second sequence are measured at a second measuring point of the onboard electrical system differing from the first measuring point A fault is detected by an evaluation unit based on a comparison of a dispersion of the measurement values of the first sequence and a dispersion of the measurement values of the second sequence.

US 2018/0083434 A1 discloses a circuit interrupter which has multiple arc detection blocks which can output a plurality of signatures assigned to an arc. Furthermore, the circuit includes a processor which receives the signatures and compares them with measurement values to identify the occurrence of a fault.

BRIEF SUMMARY

The present disclosure provides an improved method for detecting an arc fault in an electrical circuitry.

According to the disclosure, this is achieved in a method of the type mentioned at the outset in that a current measuring means for determining current measurement values describing an energy storage current is assigned to the energy storage and a voltage measuring means for determining voltage measurement values describing a load voltage at the respective load is assigned to said loads in each case, wherein the current measurement values and voltage measurement values are continuously transmitted to the controller via at least one communication link, wherein a parallel arc in the electrical circuitry is detected by comparing the current measurement values and/or a change over time of the energy storage current described by the current measurement values with at least one current limit value, and a series arc in one of the load paths is detected by comparing the voltage measurement values and/or a change over time of the load voltages of the load of the load path described by the voltage measurement values with at least one voltage limit value assigned to the respective load, wherein either in detecting the occurrence of a parallel arc the energy storage is disconnected from the loads or in detecting the occurrence of a series arc in one of the load paths, the load of this load path is switched off.

The controller of the electrical circuitry receives current measurement values which describe the energy storage current and are captured by a current measuring means assigned to the energy storage. For the loads, each being connected to the energy storage via a load path and thus form part of the electrical circuitry, voltage measurement values which describe a voltage drop at the respective load, are determined via a voltage measuring means assigned to the load, and transmitted to the controller.

The occurrence of a parallel arc in the electrical circuitry is detected by the controller based on comparing the current measurement values describing the battery current and/or the change over time of the energy storage current described by the current measurement values with at least one current limit value. Depending on the definition of the at least one current limit value, this can take place, for example, when an amount of energy storage current, and/or an amount of a change over time of the energy storage current exceeds or undershoots the current limit value. The current measurement values can each be compared directly with the current measurement value or quantities which are determined from at least one of the current measurement values, optionally taking into account other measurement values, can be compared with a current limit value. A change over time in the energy storage current can be determined by current measurement values determined at different points in time. A parallel arc fault, that is to say, the occurrence of a parallel arc in the electrical circuitry, is usually characterized by a sudden increase in current. In this case, as a rule, the current is initially fed from the capacitances present in the electrical circuitry and then taken from the energy storage as part of the energy storage current.

To detect a series arc, the controller compares the voltage measurement values and/or the change over times in the load voltages described by the voltage measurement values with at least one voltage limit value for the individual loads in each case. Depending on the definition of the at least one voltage limit value, the detection of a series arc in a load and/or in a load path of a load can take place, for example, when an amount of the load voltage and/or an amount of a change over time in the load voltage exceeds or undershoots the voltage limit value. The voltage measurement values can each be compared directly with a voltage limit value, or quantities which are determined from one or more of the voltage measurement values, optionally taking into account other measurement values, can be compared with a voltage limit value. In this case, it is possible that such a quantity is determined from one or more voltage measurement values that describe the load voltage on one of the loads. It is also possible for such a quantity to be determined from multiple voltage measurement values, each of which describes a load voltage at different ones of the loads. A change over time in the load voltage can be determined from voltage measurement values of the load voltage of a load that are determined at different points in time.

If a parallel arc is detected in the electrical circuit, the energy storage is disconnected from the loads. For this purpose, for example, a switching device assigned to the energy storage, for example a battery junction box (BJB), can be controlled in such a way that an electrical connection between the energy storage and the multiple loads is interrupted. In this way, the energy storage is disconnected from the other components, in particular all loads, of the electrical circuitry, so that a parallel arc that has arisen in the electrical circuitry is reduced.

When a series arc is detected, the load or the load path in which the series arc occurs can be determined on the basis of the voltage measurement values evaluated for the individual loads. Switching off the respective load has the effect that the serial load arc in the load or the corresponding load path is reduced due to the interruption of the power circuit in the load path. Further loads, for which no series arc occurred are still connected to the energy storage and can thus advantageously be operated after the switching off of a load due to the series arc.

The method according to the disclosure also has the advantage that, in particular in an electrical circuitry designed as an onboard electrical system of a motor vehicle, the parallel arcs and the series arcs can be detected by measurement values, which in a motor vehicle are determined already for use in other functions. The possibility of transmitting these measurement values to the controller means that the arc fault can be detected by a controller which can also perform other tasks within the motor vehicle. Since both a switching device for disconnecting the energy storage from the loads connected to the energy storage, and switching devices for connecting or switching off individual loads of the onboard electrical system are generally present in a motor vehicle onboard electrical system, the method according to the disclosure can be used to detect arc faults without additional hardware expenditure. As a result, additional hardware modules, for example additional sensors, switches or the like, can advantageously be dispensed with.

Upon the occurrence of a parallel arc, the switching device assigned to the energy storage can be controlled by the controller to disconnect the energy storage from the loads. Upon the occurrence of the series arc, the load or a switching device assigned to the load can be controlled to switch off the load. Upon the occurrence of both a parallel arc and a series arc only the energy storage can be disconnected from the loads, as this also leads to the reduction of the series arc in the power path. It is, however, possible that nevertheless the load is switched off or a switching device assigned to the load is switched on.

The comparison of the current measurement values and/or the change over time in the energy storage current described by the current measurement values can take place with one or more current limit values. In this way, various criteria, each of which includes exceeding or undershooting a current limit value, can be used to detect the parallel arc. The individual comparisons with the current limit values each represent criteria or conditions which, in each case, can represent conditions sufficient for disconnecting the energy storage. When using the deviations from multiple current limit values as sufficient conditions in each case, multiple different current limit values can be used, which, when exceeded or undershot, respectively indicate the emergence of a parallel arc and thus result in the disconnection of the energy storage from the loads. In using one or more current limit values as conditions, a plausibility check can be carried out, so that a disconnection of the energy storage from the loads takes place only when multiple current limit values are exceeded or undershot.

This also applies accordingly to the voltage measurement values describing the respective one load voltage or the changes over time in the load voltages of the respective loads. Here also, the criteria or conditions which in each case are represented by exceeding or undershooting a voltage limit value, in each case can be sufficient conditions. In this way, multiple voltage limit values can be defined, each of which indicates the occurrence of a series arc and thus causes the load to be switched off.

In the case of multiple voltage limit values, these or at least some of the voltage limit values can also represent specified conditions, so that a series arc is only detected if all of these voltage limit values are exceeded or undershot. In this way, it is possible to generate a plausibility check, so that multiple voltage limit values are specified, which in each case are exceeded or undershot by the voltage measurement values and/or by the change over time of the load voltages in order to indicate the presence of a series arc and thus to cause the load to be switched off. This enables a plausibility check of the individual measurement values and increases the robustness of the method by avoiding incorrect shutdowns due to a temporary exceeding or undershooting of one of the voltage limit values as a result of an effect not attributable to the occurrence of an arc.

The current limit values and voltage limit values used in the respective comparisons can be determined, for example, on the basis of known consumer load profiles. For example, a maximum of energy storage currents, load voltages and/or changes over time thereof occurring in normal operation of the electrical circuit can be determined by calculation and/or by measurement, so that the limit values can be chosen in such a way that they are not exceeded in normal operation. The current limit values used and/or the voltage limit values used can be determined depending on the type of electrical circuitry or depending on the type of energy storage and the loads of the electrical circuitry and stored in the controller, for example.

According to the disclosure it may be provided that mean values of the energy storage current assigned to a time interval in each case, which represent a measure of the total current flow in the time interval, are used as current measurement values, a change of the mean values over time being compared with a mean value limit value as the current limit value. The time interval can have a length between 1 ms and 100 ms, in particular between 5 ms and 50 ms. In one embodiment, the time interval is 10 ms. A mean value of the energy storage current in this time interval can be used as a current measurement value, the mean value being compared with a mean value limit value as the current limit value. The mean value can be determined, for example, by calculating and/or filtering a number of individual measurement values of the current measuring means. The mean value can be transmitted, for example, as a current measurement value via the communication link from the current measuring means assigned to the energy storage to the controller. The controller can then compare a transmitted mean value with the mean value limit value stored in the controller, for example, a parallel arc being detected when the mean value limit value is exceeded by the mean value of the energy storage current.

In one embodiment, maximum values of the energy storage current assigned to a time interval in each case, which describe a maximum amount of the energy storage current within the time interval, are used as current measurement values, a change of the maximum values over time being compared with a maximum value limit value as the current limit value. The time interval in which the maximum value of the energy storage current is specified can in particular correspond to the time interval for which a mean value is compared as a current measurement value. A comparison of the maximum value assigned to a time interval in each case is made with a maximum limit value stored in the controller, for example, wherein, if the maximum limit value is exceeded by the maximum amount of the energy storage current in the time interval, it can be concluded that a parallel arc is present.

According to the disclosure it may be provided that mean values of the energy storage current assigned to a time interval in each case, which represent a measure for the total current flow in the time interval, and maximum values of the energy storage current assigned to the time interval, which describe a maximum amount of the energy storage current within the time interval, are used as current measurement values, wherein a difference between the mean value and the maximum value of a time interval is compared with a differential limit value as a current limit value. This makes it possible to determine a deviation of the maximum amount of the energy storage current from the mean value of the energy storage current over time in the time interval for which the mean value or the maximum amount has been determined. This difference can be compared with a differential limit value stored in the controller, for example, in order to detect the occurrence of a parallel arc.

In one embodiment, the energy storage is disconnected from the loads when at least one of the current limit values is exceeded. In particular, the above-described mean value limit value, the above-described maximum limit value and the above-described differential limit value can be used as current limit values. A parallel arc is detected, or the energy storage is disconnected from the loads when at least one of the current limit values is exceeded. This advantageously makes it possible to disconnect the energy storage from the loads as soon as a criterion for detecting a parallel arc or a condition used to detect the occurrence of a parallel arc, that is to say exceeding at least one of the current limit values, is met.

According to the disclosure it may be provided that the communication link is a data bus, wherein the time interval corresponds to the time between two transmission time slots in which the current measuring means sends at least one current measurement value to the controller. In addition to the current measurement values, the voltage measurement values of the loads can also be transmitted to the controller via the data bus designed as a communication link. When the communication link is designed as a data bus, the measurement values can be transmitted to the controller individually or as a bundle in respective transmission time slots. When the current measurement values and/or the voltage measurement values are received, the controller determines in each case whether a parallel arc and/or a series arc is present and, optionally, if a parallel arc is present, the energy storage is disconnected, or if a series arc is present, the respective load is switched off in the load path of which the series arc has occurred. The bundled transmission of multiple current measurement values or voltage measurement values within a transmission time slot can take place in particular if a frequency or a sampling rate with which the current measurement values or the voltage measurement values are determined, is higher than the frequency with which the current measuring means or the voltage measuring means transmits the respective measurement values to the controller via the communication link.

According to the disclosure it may be provided that in each case a reference differential voltage between a voltage measurement value of the load and a reference voltage value of a reference voltage source, in particular a voltage of the energy storage, is determined for the loads, wherein the reference differential voltage is compared with a reference differential limit value assigned to the respective load as the voltage limit value. For the loads connected to the energy storage, a reference differential voltage can be determined in each case, wherein said voltage can represent the difference between the load voltage described by the voltage value of the load and a reference voltage value.

The voltage of a reference voltage source can be used as the reference voltage value, wherein in particular the energy storage can be used as the reference voltage source. The reference differential voltage determined in this way, for example by a measurement, can be compared with a reference differential limit value assigned to the respective load as the voltage limit value. The exceeding or undershooting of the reference differential limit value by the reference voltage may represent a sufficient condition for detecting the occurrence of a series arc in the load path of the respective load for which the reference voltage value is determined. Through the comparison with the reference voltage source it can be concluded that a fault pattern is present, which is due the occurrence of a fault such as a series arc in the load path of the load.

In one embodiment, at least one load differential voltage is determined for each of the loads between a voltage measurement value and at least one voltage measurement value of at least one other of the loads, the load differential voltage being compared with a load differential limit value assigned to the respective load as the voltage limit value. In this case, the load differential voltage is the difference between the load voltage described by the voltage value of the load and a voltage value of another one of the loads, which describes the load voltage at the other one of the loads. The load differential voltage is compared with a voltage limit value stored, for example, in the controller, wherein a sufficient condition for detecting a series arc is considered to be met when the voltage limit value is exceeded or undershot. In this case, each of the loads of the electrical circuitry can be assigned its own load differential limit value. A load can also be assigned multiple load differential limit values which are each assigned to different further loads and which are used for load differential voltages determined in relation to the respective further loads.

According to the disclosure, it may be provided that for each load the change of load voltage over time is compared with a load voltage limit value assigned to the respective load, each of the loads being switched off each time the reference differential limit value, the load differential limit value and the load voltage limit value are exceeded. In this way, exceeding or undershooting the load voltage limit value, the load differential limit value and the reference differential limit value in each case are regarded as sufficient conditions for detecting the occurrence of a series arc or for switching off the respective load. In this way, it is possible to check the plausibility of the individual voltage measurement values or the values derived from the voltage measurement values for the reference differential voltage or the load differential voltage and/or the change of the load voltage derived from the voltage measurement values. In this way, it can advantageously be avoided that the load is switched off due to a single exceeding of one of the voltage limit values used. In this case, the evaluation of the change of the load voltage over time can be used as a criterion for the occurrence of an arc, since an arc fault always results in a high voltage change, in particular a high change in the amount of the load voltage.

According to the disclosure, it may be provided that a series arc is detected when the at least one voltage limit value is exceeded for a specified period of time and/or for a specified number of chronologically successive voltage measurement values. In this way, it can be prevented that the occurrence of a series arc is detected in one of the load voltages due to voltage peaks that occur only briefly and are not caused by a series arc.

In one embodiment, the current measurement values from the current measuring means and/or the voltage measurement values from the voltage measuring means are determined with a frequency between 50 Hz and 20 kHz, in particular between 100 Hz and 10 kHz. The frequency with which the current measuring means determines the current measurement values and/or the voltage means determine the respective voltage measurement values can be, for example, 1 kHz in each case. This frequency can in particular be higher than the transmission frequency with which the current measuring means or the voltage measuring means transmit(s) the respective measurement values to the controller via the communication link. In this case, it may be provided that in a message transmitted via the communication link, multiple measurement values detected in a time interval corresponding to the transfer time interval on the communication link are transferred via the communication link. In this case, in particular by the controller, the respective comparison with the current limit values and/or the voltage limit values can be made after receiving the respective current measurement values and/or voltage measurement values. For this purpose, for example, quantities derived or calculated from the current measurement values and the voltage measurement values, such as, for example, the difference between a mean value and a maximum value of the energy storage current, a reference differential voltage and/or a load differential voltage can be determined by the controller. It is also possible that the transmission frequency with which the respective measurement values are transmitted by the current measuring means or the voltage measuring means to the controller via the communication link is adapted to the sampling rate or the measuring frequency of the current measuring means and/or the voltage measuring means.

According to the disclosure, it may be provided that the voltage measurement values are transmitted via the communication link at at least partially different times, the controller synchronizing the voltage measurement values. In the case of a communication link which enables data to be transmitted by means of transmission time slots available chronologically, it may be beneficial to synchronize the voltage measurement values transmitted by different components, in particular by different loads and/or a reference voltage source, for example to, as described above, enable a load differential voltage between a voltage measurement value of the load and a voltage measurement value of the further load assigned to the point in time at which the voltage measurement value of the load was determined. Correspondingly, this can also occur when determining the reference differential voltage, when the voltage measurement value of the load is compared to a reference voltage value determined at a corresponding point in time by forming the reference differential voltage.

In one embodiment, a controller is used which is also designed to control a flow of energy between the energy storage and at least one of the loads. Doing so advantageously enables the method to be designed for detecting the arc fault in a controller, which receives and processes the measurement values used for the detection of the arc anyway. In particular, in a controller which is designed for central energy management and can therefore be referred to as an energy management coordinator, the measurement values also used to detect the arc faults are available, since they are utilized to control a power flow in the electrical circuitry or in the motor vehicle's onboard electrical system. In this way, the existing architecture of the motor vehicle can advantageously be utilized, so that the use of additional hardware for detecting the arc faults can advantageously be dispensed with.

According to the disclosure it may be provided that an onboard electrical system of a motor vehicle, in particular an onboard electrical system with a voltage of 48 V, is used as the electrical circuitry and/or that an electrical consumer of a motor vehicle, in particular an inverter, a drive train generator, a starter generator, an electrically operated catalytic converter, an electric drive compressor and/or an electric refrigerant compressor is used as at least one of the loads. The loads can, in particular, be loads operated via an onboard electrical system of a motor vehicle, in particular via an onboard electrical system with a voltage of 48 V.

For a motor vehicle according to the disclosure it is provided that it includes an electrical circuitry with a controller, an energy storage and a plurality of loads connected to the energy storage via a load path in each case, wherein a current measuring means for determining current measurement values describing an energy storage current is assigned to the energy storage, and a voltage measuring means for determining voltage measurement values describing a load voltage at the respective load is assigned to said loads in each case, wherein the current measuring means and the voltage measuring means are connected to the controller via a communication link for the continuous transmission of the current measurement values and the voltage measurement values, wherein the controller is set up for carrying out a method according to the disclosure.

All of the advantages and configurations described above in relation to the method according to the disclosure apply accordingly to the motor vehicle according to the disclosure.

BRIEF DESCRIPTION OF THE SEVERAL VIEWS OF THE DRAWINGS

Further advantages and details of the disclosure emerge from the exemplary embodiments described below and with reference to the drawings. These are schematic representations and.

DETAILED DESCRIPTION

Figure 1:
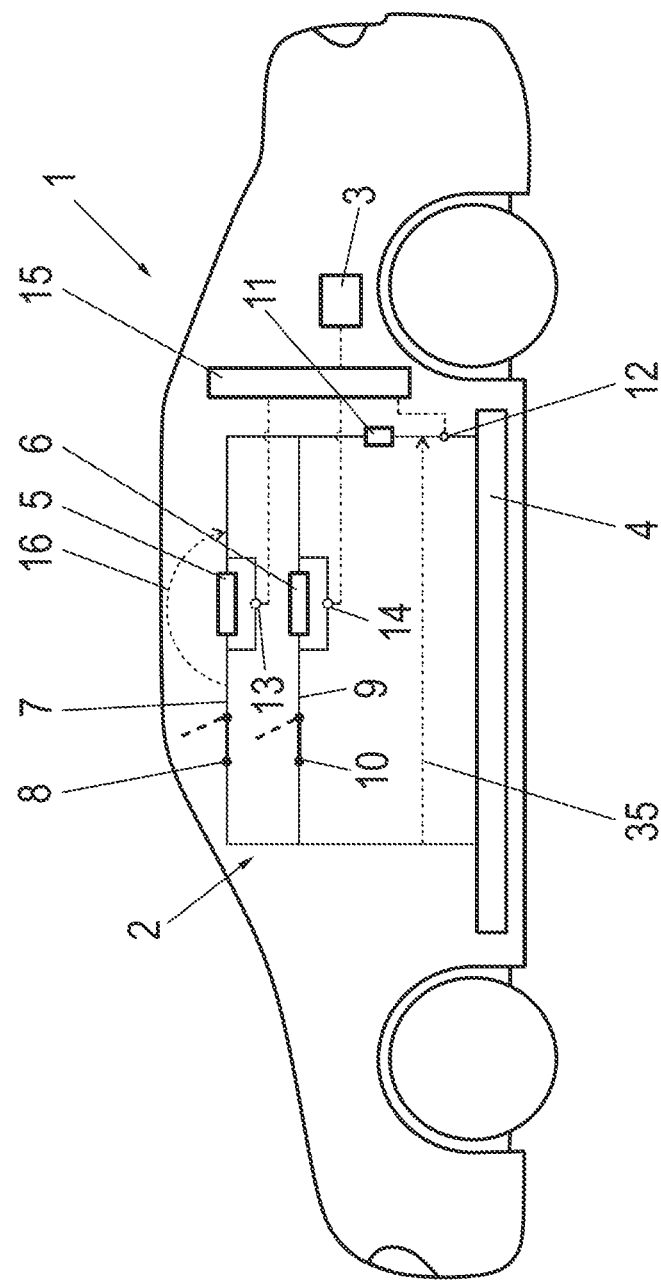
FIG. 1 shows an exemplary embodiment of a motor vehicle according to the disclosure.

FIG. 1 illustrates an exemplary embodiment of a motor vehicle 1 according to the disclosure. Motor vehicle 1 includes an electrical circuitry 2 designed as an onboard electrical system of motor vehicle 1 with a controller 3, an energy storage 4 and two loads 5, 6 connected to the energy storage 4. The loads 5, 6 are connected in parallel to one another and are connected to energy storage 4. In normal operation of the electrical circuitry 2, loads 5, 6 are operated via the energy storage 4.

Load 5 is connected to energy storage 4 via a load path 7, which includes a switch 8 for switching off load 5. Correspondingly, the further other load 6 is connected to energy storage 4 via a load path 9, which includes a switch 10 for disconnecting the load 6 from the energy storage 4. Energy storage 4 is connected to loads 5, 6 via a switching device 11, which makes it possible to disconnect energy storage 4 from loads 5, 6.

In addition to the illustrated loads 5, 6, the electrical circuitry 2 may comprise further loads which, like loads 5, 6, in each case are connected to the energy storage 4 via a load path, in particular with a switching element Loads 5, 6 and/or any further loads that may be present are, in particular, electrical consumers of motor vehicle 1, which can be operated via energy storage 4. The voltage of energy storage 4 or electrical circuitry 2 can be 48 V, for example. Loads 5, 6 and/or any further loads may be in each case, for example, an inverter, a drive train generator, a starter generator, an electrically operated catalytic converter, an electric drive compressor and/or an electric refrigerant compressor of motor vehicle 1.

A current measuring means 12 is assigned to the energy storage 4, by means of which current measurement values describing an energy storage current can be determined. A voltage measuring device 13 or 14 is assigned to each of load 5 and load 6, voltage measurement values describing a load voltage of load 5 being determined via voltage measuring means 13 and voltage measurement values describing a load voltage of load 6 being determined via voltage measuring means 14.

The current measuring means 12 and the voltage measuring means 13, 14 are connected to a communication link 15 designed as a data bus. The controller 3 of electrical circuitry 2 is also connected to communication link 15. The current measurement values measured by current measuring means 12 and the voltage measurement values measured by voltage measuring means 13, 14 are continuously transmitted to controller 3 via communication link 15.

Controller 3 is designed to detect the occurrence of a parallel arc in electrical circuitry 2 by comparing the current measurement values and/or a change of the energy storage current over time described by the current measurement values with at least one current limit value. Furthermore, controller 3 is designed to detect the occurrence of a series arc in load 5 or load path 7 by comparing the voltage measurement values and/or a change of the load voltage of load 5 over time described by the voltage measurement values with at least one voltage limit value assigned to load 5, as well as to detect the occurrence of a series arc in load 6 or load path 9 by comparing the voltage measurement values and/or a change of the load voltage of load 6 described by the voltage measurement values and at least one voltage limit value assigned to load 6.

When the occurrence of a parallel arc is detected in circuitry 2, for example along arrow 35, the energy storage 4 is disconnected from loads 5, 6. In this case, the energy storage 4 is disconnected from loads 5, 6 via switching device 11, which is designed, for example, as a battery junction box (BJB). Upon occurrence of a series arc in load path 7, for example along arrow 16, load 5 is switched off by opening switch 8 in load path 7. Correspondingly, when a series arc occurs in load path 9, load 6 is switched off by opening switch 10 in load path 9.

In this way, it is possible, that upon occurrence of the parallel arc in the electrical circuitry 2, the parallel arc is reduced due to the disconnected energy storage. Upon occurrence of a series arc a corresponding reduction of the electric arc can be achieved by disconnecting load 5 or opening switch 8. To control switches 8, 10 and switching device 11, controller 3 is connected to them. The connections between controller 3 and switches 8, 10 and switching device 11 are not shown for reasons of clarity.

Figure 2:
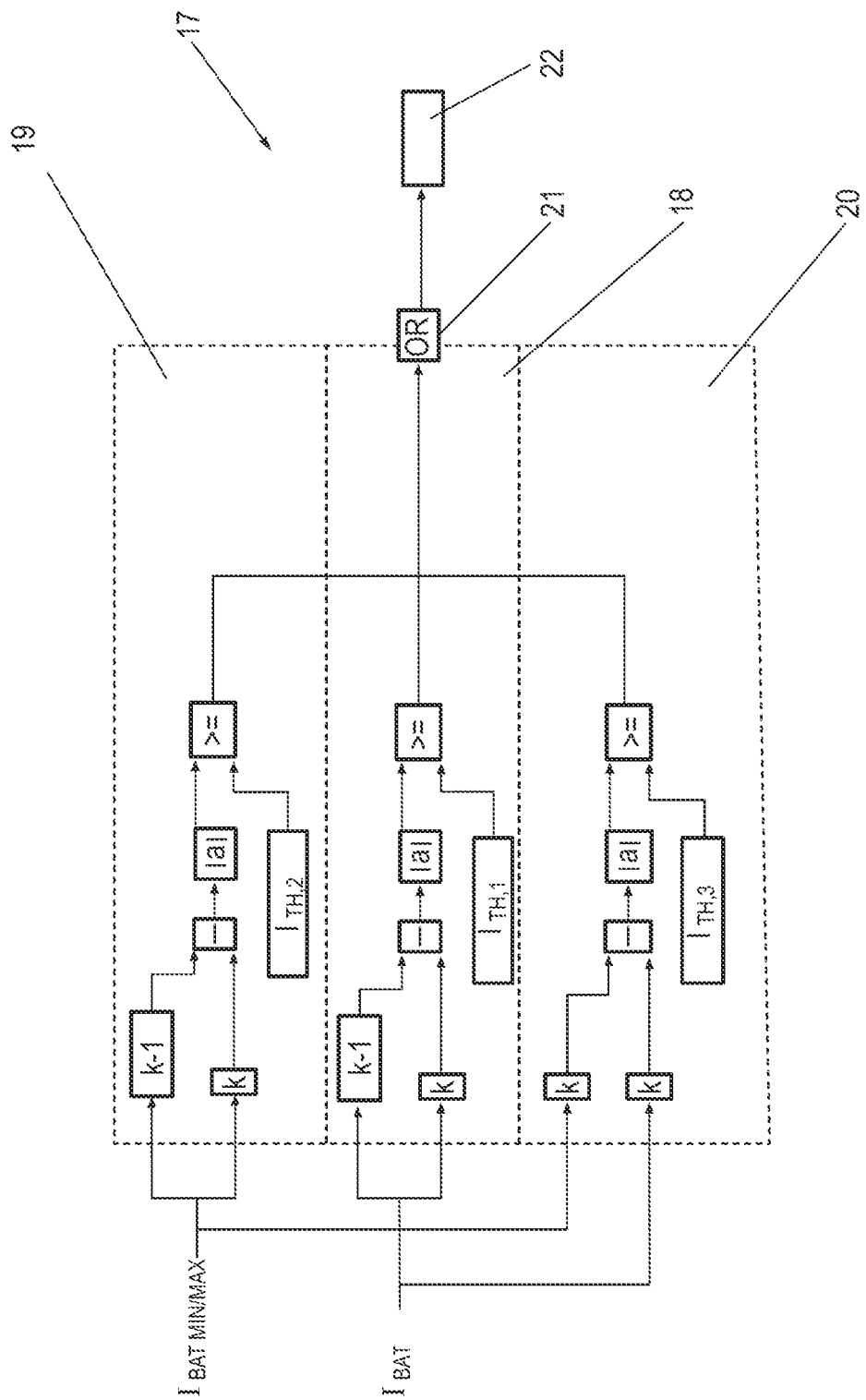
FIG. 2 shows a first block diagram to explain an exemplary embodiment of a method according to the disclosure.

FIG. 2 illustrates a schematic block diagram 17, which illustrates the determination of the occurrence of a parallel arc in electrical circuitry 2 by controller 3. Block diagram 17 includes a first section 18, a second section 19 and a third section 20. A mean value $I_{BAT}$ of the energy storage current assigned to a time interval and a maximum amount $I_{BAT\_MIN/MAX}$ of the energy storage current assigned to the time interval are used as input quantities.

The time interval to which the mean value $I_{BAT}$ and the maximum amount $I_{BAT\_MIN/MAX}$ are assigned, corresponds to the time interval in which the current measuring means 12 transmits the current measurement values to controller 3 via communications link 15. The current measurement values can be determined by current measuring means 12, for example, with a frequency between 50 Hz and 20 kHz, in particular between 100 Hz and 10 kHz. The time intervals in which current measuring means 12 transmits the current measurement values to controller 3 via communication link 15 can deviate from the frequency with which the current measurement values are determined by current measuring device 12. For example, the current measurement values can be transmitted every 10 ms from current measuring means 12 to controller 3. In this case, the time interval for which mean value $I_{BAT}$ of the energy storage current as well as maximum amount $I_{BAT\_MIN/MAX}$ are determined by current measuring means 12, is also 10 ms. When using a different time interval for the data transmission via communication link 15, the time interval in which the mean value $I_{BAT}$ and the maximum amount $I_{BAT\_MIN/MAX}$ are determined, can also correspond to the time interval of the transmission of the current measurement values via communication link 15.

Figure 3:
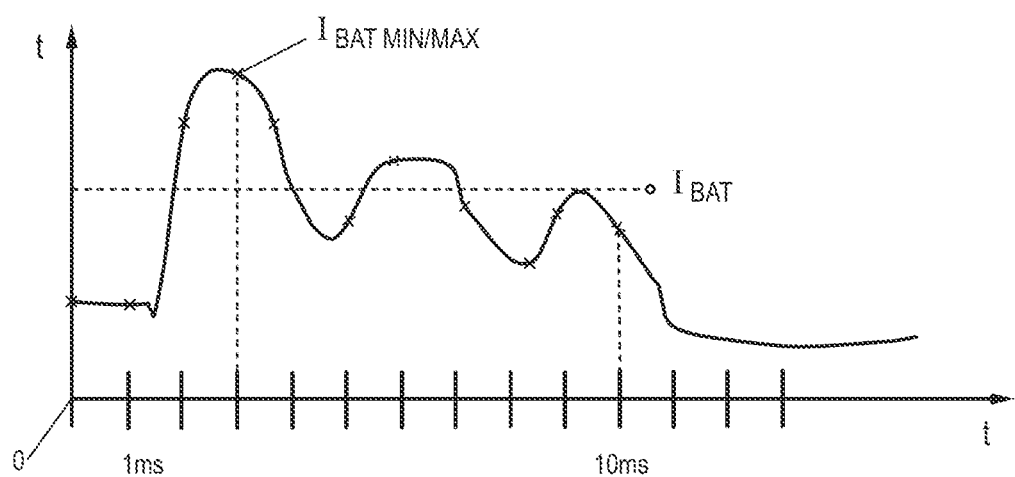
FIG. 3 shows a schematic representation of the battery current over time.

FIG. 3 illustrates a diagram in which energy storage current I is illustrated over time t by way of example. The measurement values of energy storage current I determined at a sampling frequency of 1 kHz by current measuring means 12 and the maximum amount $I_{BAT\_MIN/MAX}$ resulting in the time interval of 10 ms and the current mean value $I_{BAT}$ are also plotted. For example, since the sampling frequency of current measurement means 12 is higher than the transmission frequency from current measuring means 12 to controller 3, maximum amount $I_{BAT\_MIN/MAX}$ and mean value $I_{BAT}$ are transmitted as current measurement values to controller 3, as illustrated in block diagram 17 in FIG. 2.

It is also possible that in each case individual measurement values describing the energy storage current at a measurement time are transmitted as current measurement values from current measuring means 12 to controller 3, wherein controller 3 determines mean value $I_{BAT}$ and maximum amount $I_{BAT\_MIN/MAX}$ in particular independently of the transmission frequency of communication link 15. This can be the case, for example, if the transmission frequency with which current measuring means 12 transmits the current measurement values to controller 3 via communication link 15 corresponds to or is higher than the sampling rate or the measuring frequency of current measuring means 12 and/or if current measuring means 12 transmits multiple current measurement values as a bundle to controller 3 via communication device 15.

In the first section 18 of block diagram 17, the change of mean value $I_{BAT}$ over time determined for various time intervals of 10 ms each, is determined. Mean value $I_{BAT}$ can be, for example, an arithmetic mean value of the measurement values taken within the time interval with the sampling of current measurement means 12 and/or a filtered value resulting from measurement values taken within the time interval. In first block 18, the change of the mean value $I_{BAT}$ over time is determined from the mean values $I_{BAT}$ determined for two consecutive time intervals k and k−1, respectively. For this purpose, the amount of the difference of the mean values for these time intervals is compared with a current limit value $I_{TH,\,1}$, representing a mean value limit value.

In the second section 19 of block diagram 17, accordingly, the change of the maximum amount $I_{BAT\_MIN/MAX}$ over time which is determined from two maximum amounts $I_{BAT\_MIN/MAX}$ determined for two consecutive time intervals k and k−1, respectively. The amount of the difference between the two maximum amounts is compared with a second current limit value $I_{TH,\,2}$, which represents a maximum limit value.

In the third section 20 of block diagram 17, the mean value $I_{BAT}$ assigned to a time interval k and the maximum amount $I_{BAT\_MIN/MAX}$ assigned to the time interval k are subtracted from one another, wherein the amount of this difference is compared with a third current limit value $I_{TH,\,3}$, which represents a difference limit value. As illustrated by block 21, the respective comparisons with the current limit values $I_{TH,\,1}$, $I_{TH,\,2}$ and $I_{TH,\,3}$ are each linked with a logical "or." If at least one of the three limit values $I_{TH,\,1}$, $I_{TH,\,2}$ and $I_{TH,\,3}$ is exceeded, controller 3 detects the occurrence of a parallel arc fault, so that if one of the three limit values is exceeded in block 22, a switch off request is transmitted from controller 3 to energy storage 4 or switching device 11 and/or switching device 11 is controlled by control unit 3 and energy storage 4 is thus disconnected from loads 5, 6.

It is possible that further current limit values are used in addition or as an alternative to the mean value limit value, the maximum limit value and/or the differential limit value. A further current limit value can be compared, for example, with the current measurement values or with a further quantity determined or derived from at least one current measurement value.

Figure 4:
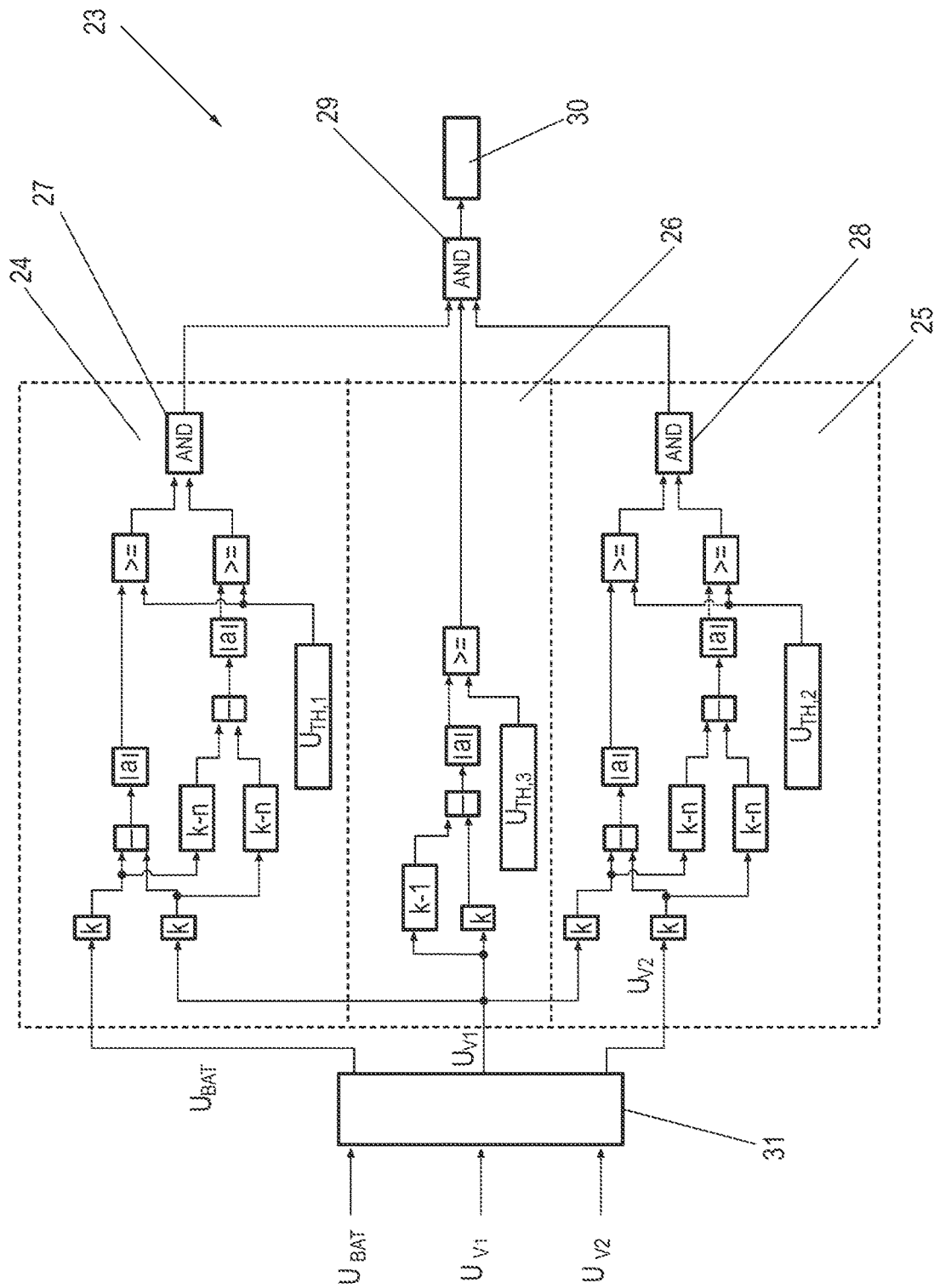
FIG. 4 shows a second block diagram for explaining the exemplary embodiment of the method according to the disclosure.

FIG. 4 illustrates a second block diagram, which describes the detection of the occurrence of a series arc in load 5 or in load path 7. The occurrence of a series arc of load 6 or in load path 9 or further loads or in the load paths of further loads of electrical circuitry 2 is detected analogously.

Block diagram 23 includes a first section 24, a second section 25 and a third section 26. Input quantities of block diagram 23 are a voltage $U_{BAT}$ of energy storage, a load voltage $U_{V1}$ at load 5, which is described by the voltage values transmitted by voltage measuring means 13 to controller 3, and a load voltage $U_{V2}$ at further load 6, which is described by the voltage measurement values captured by current measuring means 14.

In a first section 24 of block diagram 23, a reference differential voltage is determined for load 5 between a voltage measurement value of load voltage $U_{V1}$ and a reference voltage value of voltage $U_{BAT}$ of energy storage 4 used as the reference voltage. The reference differential voltage can be determined both for point in time k and for one or more previous voltage measurement values. This is illustrated in section 24 by determining the amount of a difference between the voltage measurement value of load 5 and the reference measurement value at point in time k and the determination of the corresponding amount of a difference between the voltage measurement value of load 5 and the reference voltage value of energy storage 4 at points in time k−n. The determined reference voltage values are each compared with a voltage limit value $U_{TH,\,1}$, which represents a reference differential limit value. The comparison with the reference differential limit value for the measurement values of the point in time k and the measurement values of the points in time k−n are linked with a logical "and" at the output of first section 24 in block 27.

In a second section 25 of block diagram 23, a load differential voltage between a voltage measurement value of load 5 and a voltage measurement value of a further one of the loads of electrical circuitry 2 is determined. In the present case, further load 6 is used for this purpose. Analogous to the determination of the reference differential voltage, the load differential voltage is also compared with a voltage limit value $U_{TH}$, which represents a load differential limit value, both for measurement values at point in time k and for measurement values k−n taken at previous points in time. The measurement values determined at the different points in time are linked with a logical "and" at the output of second section 25 in block 28.

In a third section 26 of block diagram 23, a change of the load voltage over time is determined from the voltage measurement values of load voltage $U_{V1}$. In this case, the change over time is determined from voltage measurement values measured at two consecutive points in time k and k−1, respectively. The change of the load voltage over time is compared with a voltage limit value $U_{TH,\,3}$, which represents a load voltage limit value.

The outputs of first section 24 and second section 25 and third section 26 are linked with a logical "and" in block 29. If, for point in time k and point(s) in time k−n, the reference differential voltage determined for first section 24 exceeds the voltage limit value $U_{TH,\,1}$ as the reference differential limit value and also in second section 25 in each case the load differential voltage determined for points in time k and k−n exceeds voltage limit value $U_{TH,\,2}$ as the load differential limit value and if in third section 26 the change of the load voltage over time at load 5 exceeds the voltage limit value $U_{TH,\,3}$ as the load voltage limit value, load 5 is switched off in block 30 due to the logical AND link in block 29. For this purpose, controller 3 controls switch 8, for example, so that it is opened.

Thus, exceeding the reference differential limit value, the load differential limit value and the load voltage limit value represent beneficial conditions for switching off load 5. This makes it possible to check the plausibility of the individual voltage measurement values which are transmitted from voltage measuring means 13 to controller 3. In this way, a three-stage plausibility check loop, which is illustrated by block diagram 23, is formed. This improves the detection of a series arc, since a plurality of states which are characteristic of the occurrence of the arc are checked.

It is possible to use further voltage limit values in addition or as an alternative to the reference differential limit value, the load differential limit value and/or the load voltage limit value. A further voltage limit value can be compared, for example, with the voltage measurement values or with further quantities determined or derived from at least one voltage measurement value.

Since the voltage measurement values are received by controller 3 at different points in time, in particular through the transmission via communication link 15 there is a synchronization upstream of the respective comparisons with the voltage limit values $U_{TH,\,1}$, $U_{TH,\,2}$ and $U_{TH,\,3}$ in block 31 which synchronizes the respectively received voltage measurement values in time. In this way, the reference differential voltages or load differential voltages determined in first section 24 and second section 25 each relate to measurement values determined at an identical point in time k, k−1 or k−n. The voltage $U_{BAT}$ of energy storage 4 used as the reference voltage may be measured by a voltage measuring means (not shown) assigned to energy storage 4 which also communicates with controller 3 via communication link 15.

The current limit values used, and the voltage limit values used are determined by calculation and/or measurement for normal operation of electrical circuitry 2, so that current values, voltage values and/or changes in them over time at energy storage 4 occurring during fault-free operation of loads 5, 6 do not lead to the respective limit values being exceeded. The limit values which are, for example, stored in controller 3, can be chosen depending on the time intervals used for the determination of the voltage measurement values and/or current measurement values. The voltage limit values can be at least partially different in each case, in particular for loads 5, 6 and/or further loads.

Figure 5:
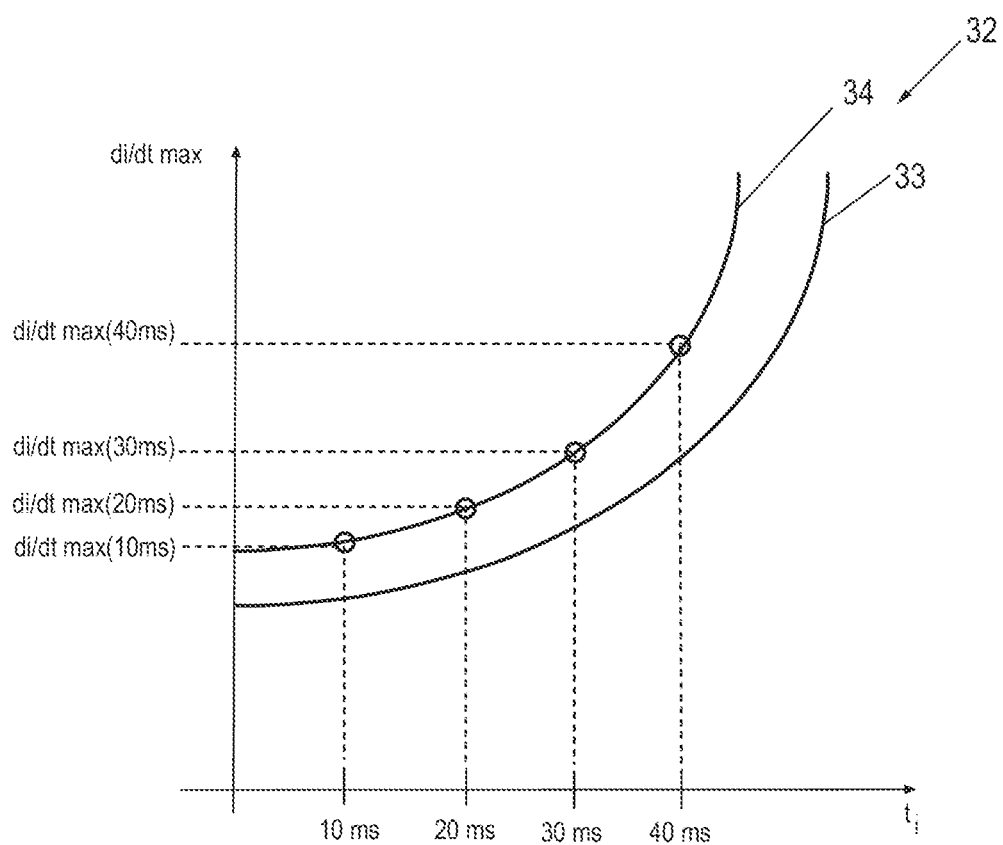
FIG. 5 shows a diagram for explaining the determination of current limit values.

The determination of a current limit value is shown schematically in FIG. 5 in a diagram 32, wherein different maximum limit values $di/dt_{\_max}$ for the change of the energy storage current over time are specified for different time intervals having a duration $t_i$ of 10 ms, 20 ms, 30 ms and 40 ms, respectively. In this case, as illustrated in first section 19 of block diagram 17 in FIG. 2, the maximum limit values can be used as a current limit value $I_{TH,\,1}$, and compared with the maximum amounts $I_{BAT\_MIN/MAX}$ in each case determined for the time interval $t_i$ of the respective duration specified.

In this case, the area located below a curve 33 represents an area of normal operation containing respective maximum allowable current changes for the various time intervals, which are achieved in a normal operation of electrical circuitry 2, that is to say without the occurrence of a parallel arc. A tripping area is located in an area above a curve 34, wherein curve 34 specifies the respective values of the maximum limit value which is compared with the maximum values of the energy storage current determined within the respective time intervals.

A tolerance range is provided between curves 33 and 34 in order to avoid false tripping due to the working range being exceeded slightly.

Corresponding curves 33 and 34 can also be determined for the further current limit values and for the further voltage limit values for individual loads 5, 6 as a function of the transmission time slots made possible in each case by the communication link. This makes it possible to determine the load profiles of loads 5, 6 in normal operation of electrical circuitry 2 and to determine corresponding limit values which are stored in controller 3 and can be used as criteria or conditions for determining a parallel arc and/or a series arc in electrical circuitry 2.

Patent Application No. 102020128054.8, filed in Germany on Oct. 26, 2020, to which this application claims priority, is hereby incorporated herein by reference, in its entirety.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for detecting an arc fault in an electrical circuitry including a switching device electrically coupled between plurality of loads and an energy storage that stores energy, the method comprising:
   determining, with a current measuring device electrically coupled between the energy storage and the switching device of the electrical circuitry, current measurement values indicative of an energy storage current between the energy storage and a plurality of loads of the electrical circuitry, wherein the current measuring values include, for each time interval of a plurality time intervals, a mean value of the energy storage current and a maximum value of the energy storage current;
   determining, for each load of the plurality of loads of the electrical circuitry, voltage measurement values indicative of a load voltage at the load with a respective voltage measuring device electrically coupled to the load, wherein each load is connected to the energy storage by a respective load path;
   continuously transmitting the current measurement values and the voltage measurement values to a controller of the electrical circuitry via at least one communication link, wherein a sampling frequency of the current measuring device is higher than a transmission frequency of the current measurement values from the current measuring device to the controller;
   detecting a parallel arc in the electrical circuitry by comparing the current measurement values or a change over time of the energy storage current indicated by the current measurement values with at least one current limit value;
   detecting a series arc in one of the load paths by comparing the voltage measurement values or a change over time of the load voltages of the load associated with the load path indicated by the voltage measurement values with at least one voltage limit value assigned to the respective load; and
   disconnecting, via the switching device, the energy storage from the load associated with the one of the load paths responsive to detecting the parallel arc or switching off the load associated with the one of the load paths responsive to detecting an occurrence of the series arc in the one of the load paths.

2. The method according to claim 1, wherein each current measurement value is a mean value of the energy storage current representing a measurement of a total current flow from a respective time interval, wherein a change over time in the mean values is compared with a mean value limit value as the current limit value.

3. The method according to claim 2, wherein the communication link is a data bus, wherein the time interval corresponds to the time between two transmission time slots in which the current measuring device sends at least one current measurement value to the controller.

4. The method according to claim 1, wherein each current measurement value is a maximum value of the energy storage current in a respective time interval, wherein a change over time in the maximum values is compared with a maximum value limit value as the current limit value.

5. The method according to claim 1, wherein the controller, in operation, for each time interval of the plurality time intervals, compares a difference between the mean value and the maximum value with a differential limit value as the current limit value.

6. The method according to claim 1, comprising disconnecting the energy storage from the loads when the current measurement values or the change over time of the energy storage current indicated by the current measurement values exceed the at least one current limit value.

7. The method according to claim 1, further comprising:
determining, for each load, at least one respective reference differential voltage between a voltage measurement value of the load and a reference voltage value of the energy storage; and
comparing, for each load, the at least one respective reference differential voltage with a reference differential limit value assigned to the load.

8. The method according to claim 7, further comprising:
determining, for each load, at least one load differential voltage between a voltage measurement value of the load and at least one voltage measurement value of at least another one of the loads; and
comparing, for each load, the load differential voltage with a load differential limit value assigned to the load.

9. The method according to claim 8, further comprising:
comparing, for each load, the change over time of the load voltage with a load voltage limit value assigned to the load; and
switching off each load when the corresponding at least one respective reference differential voltage exceeds the reference differential limit value assigned to the load, the corresponding load differential voltage exceeds the load differential limit value, and the corresponding change over time of the load voltage exceeds the load voltage limit value.

10. The method according to claim 1, comprising detecting the series arc when the voltage measurement values or the change over time of the load voltages of the load associated with the load path indicated by the voltage measurement values exceeds the at least one voltage limit value for a predetermined time period or for a predetermined number of consecutive voltage measurements.

11. The method according to claim 1, comprising determining the current measurement values or the voltage measurement values with a frequency between 50 Hz and 20 kHz.

12. The method according to claim 1, comprising:
transmitting the voltage measurement values for each load at at least partially different times via the communication link; and
synchronizing the voltage measurement values with the controller.

13. The method according to claim 1, further comprising controlling, with the controller, a flow of energy between the energy storage and at least one of the loads.

14. The method according to claim 1, wherein the electrical circuitry includes an onboard electrical system of a motor vehicle with a voltage of 48 V, wherein at least one of the loads includes an electrical consumer of a motor vehicle selected from a group including an inverter, a drive train generator, a starter generator, an electrically operated catalytic converter, an electric drive compressor and an electric refrigerant compressor.

15. The method according to claim 1, wherein the electrical circuitry includes a respective switch different from the switching device in each respective load path, and wherein the controller, in operation, switches off the respective switch in the one of the load paths to switch off the load associated with the one of the load paths responsive to detecting the occurrence of the series arc in the one of the load paths.

16. A motor vehicle, comprising:
electrical circuitry including:
a controller;
an energy storage that, in operation, stores energy;
a plurality of loads each connected to the energy storage via a respective load path;
a switching device electrically coupled between the energy storage and the plurality of loads;
a current measuring device electrically coupled between the switching device and the energy storage that, in operation, stores energy,
wherein the current measuring device, in operation, determines current measurement values indicative of an energy storage current between the energy storage and a plurality of loads of the electrical circuitry, wherein the current measurement values include, for each time interval of a plurality time intervals, a mean value of the energy storage current and a maximum value of the energy storage current; and
a plurality of voltage measuring devices,
wherein each of the voltage measuring devices, in operation, voltage measurement values indicative of a load voltage at a respective load of the plurality of loads,
wherein the current measuring devices and the voltage measuring devices are connected to the controller via a communication link which, in operation, continuously transmits the current measurement values and the voltage measurement values, and wherein the controller, in operation:
determines, with the current measuring device, the current measurement values;
determines the voltage measurement values with the voltage measuring devices;
continuously transmits the current measurement values and the voltage measurement values to the controller via at least one communication link, wherein a sampling frequency of the current measuring device is higher than a transmission frequency of the current measurement values from the current measuring device to the controller;
detects a parallel arc in the electrical circuitry by comparing the current measurement values or a change over time of the energy storage current indicated by the current measurement values with at least one current limit value;

detects a series arc in one of the load paths by comparing the voltage measurement values or a change over time of the load voltages of the load associated with the load path indicated by the voltage measurement values with at least one voltage limit value assigned to the respective load; and disconnects, via the switching device, the energy storage from the load associated with the one of the load paths responsive to detecting the parallel arc or switches off the load associated with the one of the load paths responsive to detecting an occurrence of the series arc in the one of the load paths.

17. The motor vehicle according to claim 16, wherein the electrical circuitry includes a respective switch different from the switching device in each respective load path, and wherein the switching off the load associated with the one of the load paths responsive to detecting the occurrence of the series arc in the one of the load paths includes switching off the respective switch in the one of the load paths.

* * * * *